US012689342B2

(12) United States Patent
Huang et al.

(10) Patent No.: US 12,689,342 B2
(45) Date of Patent: Jul. 21, 2026

(54) AUTO ZERO TECHNIQUES FOR HIGH VOLTAGE ANALOG FRONT-END WITH ROBUST AC COMMON-MODE REJECTION

(71) Applicant: TEXAS INSTRUMENTS INCORPORATED, Dallas, TX (US)

(72) Inventors: Chienyu Huang, Dallas, TX (US); Peng Cao, Dallas, TX (US); Kevin Scoones, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 571 days.

(21) Appl. No.: 18/187,870

(22) Filed: Mar. 22, 2023

(65) Prior Publication Data

US 2024/0146267 A1     May 2, 2024

Related U.S. Application Data

(60) Provisional application No. 63/421,794, filed on Nov. 2, 2022.

(51) Int. Cl.
H03F 3/45          (2006.01)

(52) U.S. Cl.
CPC ...  H03F 3/45475 (2013.01); H03F 2200/375 (2013.01)

(58) Field of Classification Search
CPC ............. H03F 3/45475; H03F 3/45197; H03F 3/45744; H03F 3/45968; H03F 2200/375; H03F 2203/45044; H03F 2203/45048; H03F 2203/45356; H03F 2203/45138; H03F 2203/45528; H02M 1/123

USPC ......................................................... 330/252
See application file for complete search history.

(56) References Cited

U.S. PATENT DOCUMENTS

| | | | |
|---|---|---|---|
| 7,508,258 B2 | 3/2009 | Yoshizawa | |
| 2013/0038388 A1 | 2/2013 | Jiang | |
| 2013/0076439 A1 | 3/2013 | Lin | |
| 2013/0241637 A1* | 9/2013 | Ivanov | H03F 3/45977 330/69 |
| 2019/0131943 A1 | 5/2019 | Chen | |
| 2022/0271767 A1* | 8/2022 | Oh | G11C 27/026 |

OTHER PUBLICATIONS

"Zero-Drift, Single-Supply, Rail-to-Rail Input/Output Operational Amplifiers" Analog Devices (Year: 2015).*

(Continued)

*Primary Examiner* — Andrea Lindgren Baltzell
*Assistant Examiner* — Nareh Shamiryan
(74) *Attorney, Agent, or Firm* — Charles F. Koch

(57)          ABSTRACT

The techniques and circuits, described herein, include solutions for auto-zeroing in auto-zero amplifiers in the presence of high frequency alternating current (AC) noise. In some aspects, first and second inputs of an auto-zero amplifier are coupled to a differential voltage with high AC noise. During an auto-zero phase, a first switching network decouples the inputs of a first amplifier, comprised within the auto-zero amplifier, from the differential voltage with high AC noise. In some examples, the inputs of the first amplifier may be connected to a regulated direct current (DC) voltage. The regulated DC voltage provides a more accurate auto-zero for the auto-zero amplifier, such that higher overall accuracy is achieved during an operation phase.

17 Claims, 10 Drawing Sheets

(56) References Cited

OTHER PUBLICATIONS

Eric Nolan. "Demystifying Auto-Zero Amplifiers—Part 1." Published Mar. 2000.
Thomas Kugelstadt. "Auto-zero amplifiers ease the design of high-prescision circuits." Published 2005.
International Search Report dated Mar. 11, 2024.

* cited by examiner

AUTO ZERO TECHNIQUES FOR HIGH VOLTAGE ANALOG FRONT-END WITH ROBUST AC COMMON-MODE REJECTION

CROSS-REFERENCE TO RELATED APPLICATION

This application claims the benefit of U.S. Provisional Application No. 63/421,794, filed on Nov. 2, 2022, the contents of which are hereby incorporated by reference in their entirety.

BACKGROUND

Amplifiers, such as operation amplifiers, can be used to perform a wide variety of functions in electronics circuits such as voltage buffering, inversion, amplification, integration, differentiation, etc. Auto-zero amplifiers are a specialized type of amplifier that are characterized by their low offset voltage.

SUMMARY

In one example, a circuit includes a first input voltage terminal, a second input voltage terminal, a direct current (DC) voltage input terminal, and an output voltage terminal. A first amplifier has a first input coupled to the first input voltage terminal via a first main switch, and a second input coupled to the second input voltage terminal via a second main switch. An output of the first amplifier is coupled to the output voltage terminal. An operation path extends between the output of the first amplifier and the output voltage terminal. A calibration path is arranged electrically in parallel with the operation path. A second amplifier is arranged along the calibration path and has a first input coupled to the output of the first amplifier, a second input coupled to the DC voltage terminal, and an output coupled to the output voltage terminal. A third main switch is coupled between first and second inputs of the first amplifier.

In one example, a circuit includes a first input voltage terminal, a second input voltage terminal, and a third input voltage terminal. A first amplifier has a first input, a second input, and an output. A first main switch is coupled between the first input voltage terminal and the first input of the first amplifier. A second main switch is coupled between the second input voltage terminal and the second input of the first amplifier. A third main switch is coupled between the third input voltage terminal and the first input of the first amplifier, and a fourth main switch is coupled between the third input voltage terminal and the second input of the first amplifier. A second amplifier has a first input, a second input, and an output. A first auto-zero switch is coupled between the output of the first amplifier and the first input of the second amplifier. A second auto-zero switch is coupled between a fourth input voltage terminal and the second input of the second amplifier. The output of the second amplifier is coupled to the output of the first amplifier.

In one example, an auto-zero amplifier includes a first amplifier having a first input, a second input, and an output. A first switching network is coupled to the first and second inputs of the first amplifier. The first switching network is configured to provide a first input voltage to the first input of the first amplifier and a second input voltage to the second input of the first amplifier during an operation phase, and configured to couple the first and second inputs of the first amplifier during an auto-zero phase. A sampling capacitor is coupled to the second input of the first amplifier. Auto-zeroing circuitry is coupled to the output of the first amplifier. The auto-zeroing circuitry includes a first auto-zero capacitor and is configured to compensate for an input offset voltage of the first amplifier during the operation phase based on a voltage on the first auto-zero capacitor.

DETAILED DESCRIPTION

The drawings are not drawn to scale.

Differential amplifiers, such as operational amplifiers ("op amps"), are a class of electronic devices that produce an amplified output based on a difference in potential (e.g., voltage) between two inputs. Auto-zero amplifiers are one type of differential amplifiers that are characterized by their low offset voltage.

Figure 1:
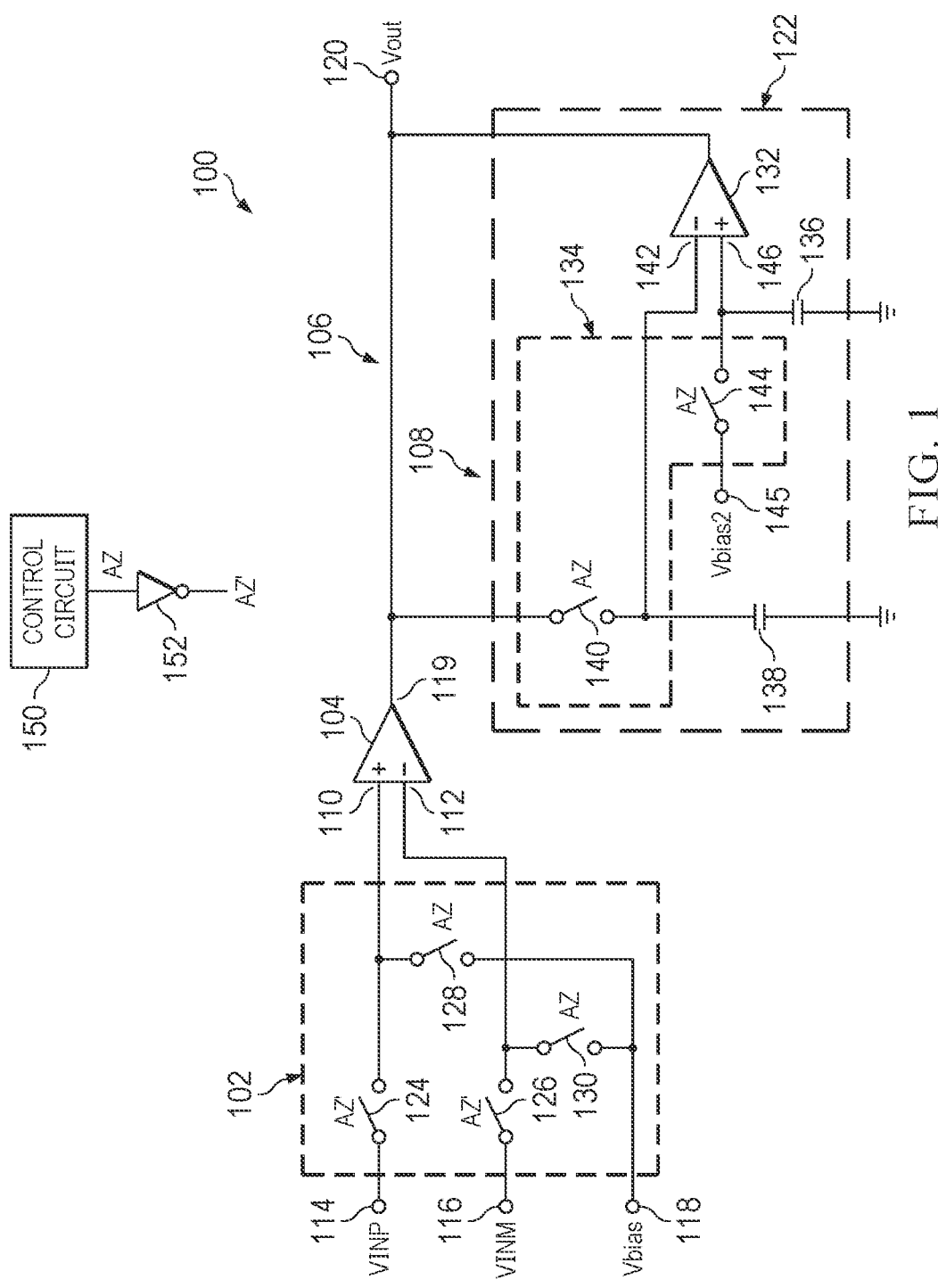
FIG. 1 is a circuit schematic of an auto-zero amplifier including a switching network connected to a direct current (DC) bias voltage in accordance with some aspects of the present disclosure.

FIG. 1 illustrates an example of an auto-zero amplifier 100 in accordance with some aspects of the present disclosure. The auto-zero amplifier 100 includes first and second input terminals 114, 116 on which an input voltage potential is received, and an output terminal 120 on which an output voltage potential is provided. A first amplifier 104 (e.g., a "main" amplifier) has first and second inputs 110, 112 coupled to the first and second inputs 114, 116, respectively. An operation path 106 extends from an output of the first amplifier 104 to the output terminal 120. A calibration path 108 extends in parallel with the operation path 106, and auto-zeroing circuitry 122 including a second amplifier 132 (e.g., a "nulling" amplifier) is arranged along the calibration path 108.

During operation, auto-zero amplifiers such as auto-zero amplifier 100 make use of an operational mode and an auto-zero mode. During the operational mode, auto-zero amplifiers receive a differential input voltage on their first and second inputs (e.g., 114, 116), and output an amplified voltage at their output terminal (e.g., 120). The amplified voltage differs from the differential input voltage according to an amplification factor, referred to as the "gain" of the amplifier. The gain can be negative (e.g., <0 decibels (dB)), positive (e.g., >0 dB), or unity (e.g., =0 dB) depending on various factors such as feedback paths, open loop gain values, etc. When the same voltage level is provided at the first and second inputs during operational mode, the output on the main amplifier (e.g., 119) and on the output terminal will ideally be zero. However, due to minor variance in the internal components of the main amplifier (e.g., slight mismatches in resistor values that occurs during manufacturing, etc.), the main amplifier can potentially deliver a non-zero output even when the same voltage level is provided at the first and second inputs. This undesirable condition is known as "non-zero offset".

Auto-zero mode is used to help minimize non-zero offset. During auto-zero mode, the calibration path determines a correction signal to "cancel" the non-zero offset. Then, once the auto-zero mode has determined the appropriate correction signal, the auto-zero amplifier 100 returns to the operational mode and the calibration path applies this correction signal to the output terminal to minimize the non-zero offset. In this way, auto-zero amplifiers provide an extremely low zero offset, while still providing an accurate gain.

Some aspects of the present disclosure lie in the appreciation that for conventional auto-zero amplifiers, when common-mode alternating current (AC) noise is present on the first and/or second inputs, the AC noise can cause undesired variations in how the calibration path determines the correction signal during the auto-zero mode. In an ideal scenario, the auto-zero amplifier would have an infinitely high AC common-mode rejection ratio (CMRR), and the common-mode AC noise would simply be rejected. However, this is often not achievable in reality due to limitations in manufacturing, materials, etc. In the wake of such AC noise, these undesired variations can lead to a small, but still significant non-zero offset at the output of the auto-zero amplifier. The offset error can also change in time over multiple auto-zero cycles which track the AC noise, and become an AC residue error.

Accordingly, the present disclosure provides for auto-zero amplifiers that apply a direct current (DC) bias to the first amplifier 104 and second amplifier 132 during an auto-zero mode to determine a correction signal. Then, during an operational mode, this correction signal can be applied to the output terminal 120 while AC noise is still present on the first input and/or second input in a manner that provides a reduced non-zero offset at the output of the auto-zero amplifier, relative to other approaches. Hence, this correction signal is independent from the AC noise, and should correct solely for circuit error (like mismatch) in the first amplifier 104 and second amplifier 132.

To help achieve robust AC noise immunity, the auto-zero amplifier 100 of FIG. 1 includes a DC voltage terminal 118, a first switching network 102, a second switching network 134, a first auto-zero capacitor 138, and a second auto-zero capacitor 136, which are operably coupled as shown. A control circuit 150 provides an auto-zero signal AZ and a complementary auto-zero signal AZ' as shown. The complementary signal AZ' may be generated, for example, by connecting the signal AZ to an inverter 152. The input of the inverter 152 is AZ and the output of the inverter is AZ'. In some aspects, the signal AZ is provided a state of TRUE or "high" during the auto-zero phase, and the signal AZ' is provided a state of TRUE or "high" during the operation phase.

The first switching network 102 comprises a first main switch 124, a second main switch 126, a third main switch 128, and a fourth main switch 130. The first main switch 124 is coupled between the first input voltage terminal 114 and the first input 110 of the first amplifier 104 (e.g., the first input voltage terminal 114 is coupled to the first input 110 of the first amplifier 104 via the first main switch 124). Similarly, the second main switch 126 is coupled between the second input voltage terminal 116 and the second input 112 of the first amplifier 104. The third main switch 128 is coupled between the first input 110 of the first amplifier 104 and the third voltage input terminal 118. The fourth main switch 130 is coupled between the second input 112 of the first amplifier 104 and the third voltage input terminal 118. Control terminals of the first main switch 124 and the second main switch 126 are coupled together.

The second switching network 134 comprises a first auto-zero switch 140 coupled between the output 119 of the first amplifier 104 and a first input 142 of the second amplifier 132, and a second auto-zero switch 144 coupled between a fourth voltage input terminal 145 and a second input 146 of the second amplifier 132. The fourth voltage input terminal 145 provides a voltage Vbias2, which may be the same voltage or a different voltage than Vbias. The first auto-zero capacitor 138 is coupled between the first input 142 of the second amplifier 132 and ground. The second auto-zero capacitor 136 is coupled between the second input 146 of the second amplifier 132 and ground. Control terminals of the third main switch 128, fourth main switch 130, first auto-zero switch 140, and second auto-zero switch 144 are coupled together. The first and second amplifiers 104, 132 are typically included on an integrated circuit, while the first auto-zero capacitor 138 and/or second auto-zero capacitor 136 are often external to the integrated circuit but can be also be included on the integrated circuit in some instances. In still other embodiments, the second auto-zero switch 144 and first auto-zero capacitor 136 may be omitted.

During an auto-zero phase, control circuit 150 enables the AZ signal, which disables the AZ' signal, such that the first main switch 124 and the second main switch 126 are open while the third main switch 128 and fourth main switch 130 are closed. In this way, the inputs 110, 112 of the first amplifier 104 are disconnected from the first and second input voltage terminals 114, 116 and are coupled together (e.g., shorted) and held at a regulated DC voltage Vbias, which is provided by the third input voltage terminal 118. The shorted inputs 110, 112 provide a differential voltage of 0 Volts to the first amplifier 104 during the auto-zero phase, such that the output 119 is based solely on the input offset voltage of the first amplifier 104. Since the inputs 110, 112 of the first amplifier 104 are disconnected from the first and second voltage input terminals 114, 116, they are decoupled from (and therefore immune to) any common-mode AC noise on the first and second voltage input terminals 114, 116.

Further during the auto-zero phase, the first auto-zero switch 140 is closed, causing the second switching network 134 to couple a voltage of the output 119 of the first amplifier 104 to the first auto-zero capacitor 138 and to the input 142 of the second amplifier 132. The second auto-zero switch 144 is also closed, such that the second switching network 134 further couples the fourth voltage input terminal 145 (and hence the DC voltage Vbias2) to the second input 146 of the second amplifier 132. In this way, the first auto-zero capacitor 138 may be calibrated (e.g., charged or discharged) to the voltage of the output 119 of the first amplifier 104, and the second auto-zero capacitor 136 may be charged to the voltage Vbias2 provided by the fourth voltage input terminal 145. Hence, the second amplifier 132 delivers an output whose voltage level is "tuned" to account for manufacturing variations in the auto-zero amplifier 100 and independent of AC noise.

During the operation phase, control circuit 150 disables the AZ signal, which enables the AZ' signal, such that the first and second main switches 124, 126 are closed and the third and fourth main switches 128, 130 are open. Thus, the first amplifier 104 amplifies a difference in voltage between the first and second voltage input terminals 114, 116 based on a gain of the first amplifier 104. At the same time, first and second auto-zero switches 140, 144 in the auto-zeroing circuitry 122 are opened, causing the second amplifier 132 to provide a correction signal that compensates for the input offset voltage of the first amplifier 104 based on the calibrated voltage stored on the first and second auto-zero capacitors 138, 136 from the auto-zero phase. Thus, the voltage at the output terminal 120 is the "compensated" voltage, whereby the auto-zero amplifier 100 has effectively "auto-zeroed" itself.

Therefore, even when AC noise is present on the first and second inputs 114, 116, the first switching network 102 advantageously eliminates the AC noise during the auto-zero phase by decoupling the inputs 110, 112 from the first and second voltage input terminals 114, 116 and instead coupling the inputs 110, 112 to the voltage Vbias (e.g., a regulated voltage with little to no AC noise). Because the calibrated voltage stored on the first auto-zero capacitor 138 is now based on a regulated DC signal (rather than a signal that includes AC noise), the correction signal provided by the calibration path 108 during operation mode offers improved accuracy compared to other approaches even in the wake of AC noise on first and second voltage input terminals 114, 116 during operation mode.

Figure 2:
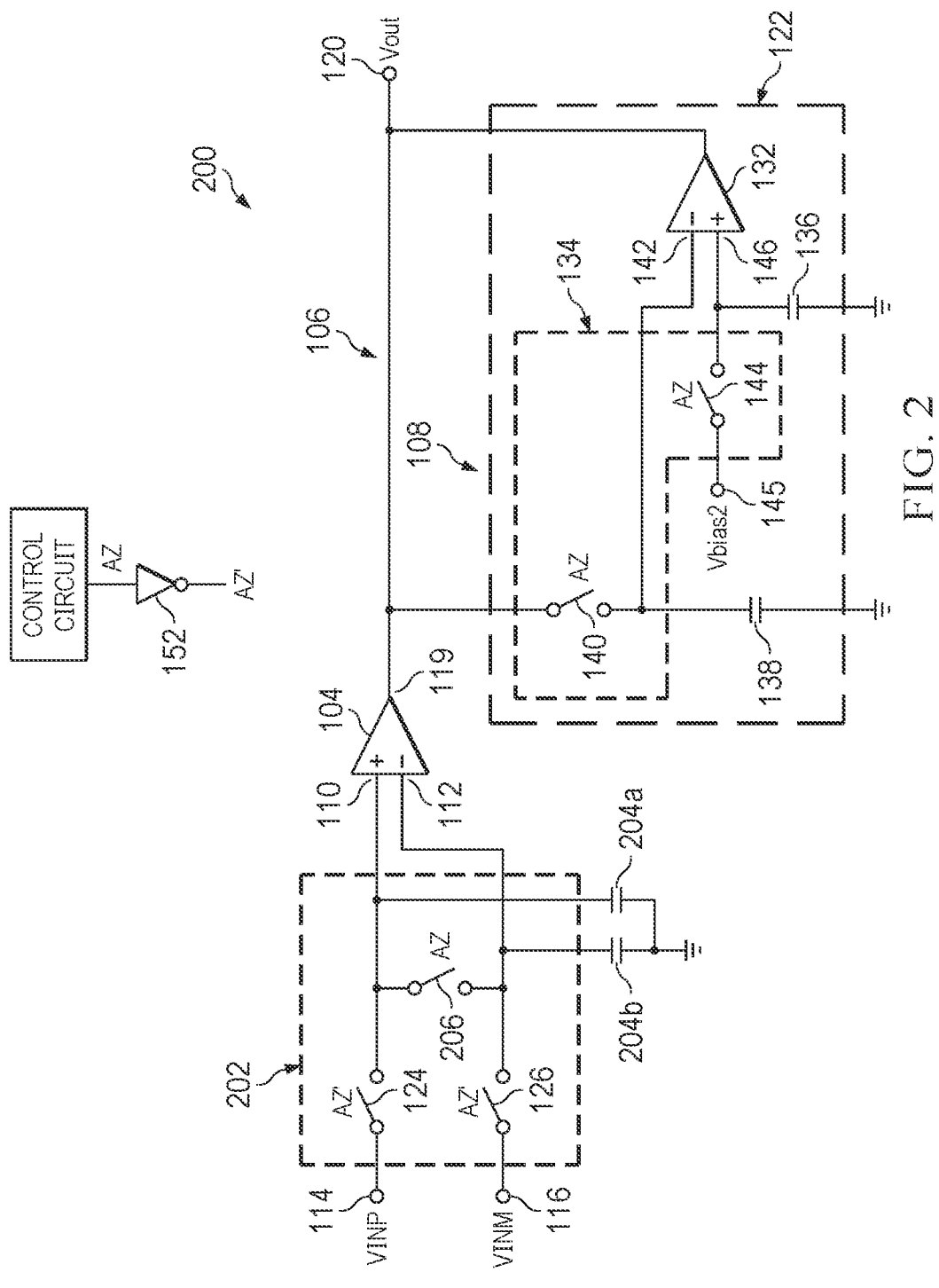
FIG. 2 is a circuit schematic of an auto-zero amplifier including a switching network and a capacitor to sample and hold a DC voltage in accordance with some aspects of the present disclosure.

FIG. 2 illustrates another auto-zero amplifier 200 in accordance with some aspects of the present disclosure. The auto-zero amplifier 200 again includes first and second input terminals 114, 116 on which an input voltage potential is received, and an output terminal 120 on which an output voltage potential is provided. The auto-zero amplifier 200 also again comprises a first amplifier 104, an operation path 106, and a calibration path 108, wherein the calibration path is arranged electrically in parallel with the operation path 106 and comprises auto-zeroing circuitry 122 as previously described.

In FIG. 2, however, the first switching network 202 includes an equalizing switch 206 coupled between the first input 110 of the first amplifier 104 and the second input 112 of the first amplifier 104. A sampling capacitor 204a is coupled between the first input 110 and ground, and a sampling capacitor 204b is coupled between the second input 112 and ground.

An operation phase corresponds to when the auto-zero signal (AZ) is disabled and complementary auto-zero signal (AZ') is enabled (e.g. such that switches 124, 126 are closed, and switches 206, 140, and 144 are open). Thus, during the operation phase, the voltage stored on the sampling capacitors 204a, 204b charges or discharges to reflect a voltage of the first and second input terminals 114, 116 respectively. In this way, the common mode voltage between the first and second input terminals 114, 116 is "sampled" (e.g., charged/discharged) by the sampling capacitors 204a, 204b (collectively referred to as "sampling capacitor 204) during the operation phase. During the auto-zero phase (e.g., when the AZ is enabled and AZ' is disabled), the sampling capacitor 204 "holds" this voltage. The "held" voltage will be a value between the "sampled" voltages of the individual sampling capacitors 204a, 204b (e.g., the voltages of the sampling capacitors 204a, 204b will equalize since they are coupled together by the equalizing switch 206). Since the sampling capacitor 204 is not coupled to the first and second input terminals 114, 116 during the auto-zero phase, and the current flowing into the first and second inputs 110, 112 of the first amplifier 104 is very low (on the order of nano-amperes (nA)), the voltage of the sampling capacitor 204 remains substantially constant throughout the auto-zero phase, during which the first auto-zero capacitor 138 is calibrated. Based on a calibrated voltage stored on the first auto-zero capacitor 138 during the auto-zero phase, an input offset voltage of the auto-zero amplifier 132 may be compensated for during the operation phase. Since the voltage from the second input terminal 116 is "sampled" and "held", the first and second inputs 110, 112 of the first amplifier 104 can be decoupled from the first and second input terminals 114, 116 during the auto-zero phase, thereby reducing or even eliminating AC noise from the first and second input terminals 114, 116. The DC voltage held by the sampling capacitor 204 can be used to provide accurate calibration of the first auto-zero capacitor 138. Although the voltage held by the sampling capacitor 204 may vary depending on when the common mode voltage between the first 114 second input terminal 116 was sampled (e.g., depending which part of the AC noise was captured), auto-zero accuracy is not impacted, since the DC voltage provided to the first and second inputs 110, 112 is the same (e.g., common-mode, with a potential difference of 0 Volts) and it is common for amplifier 104 to have a very high DC CMRR. The high DC CMRR rejects the common-mode DC signal, and auto-zero accuracy is not impacted. Further details of the sample and hold technique are described, for example, with reference to FIG. 4B.

Figure 3:
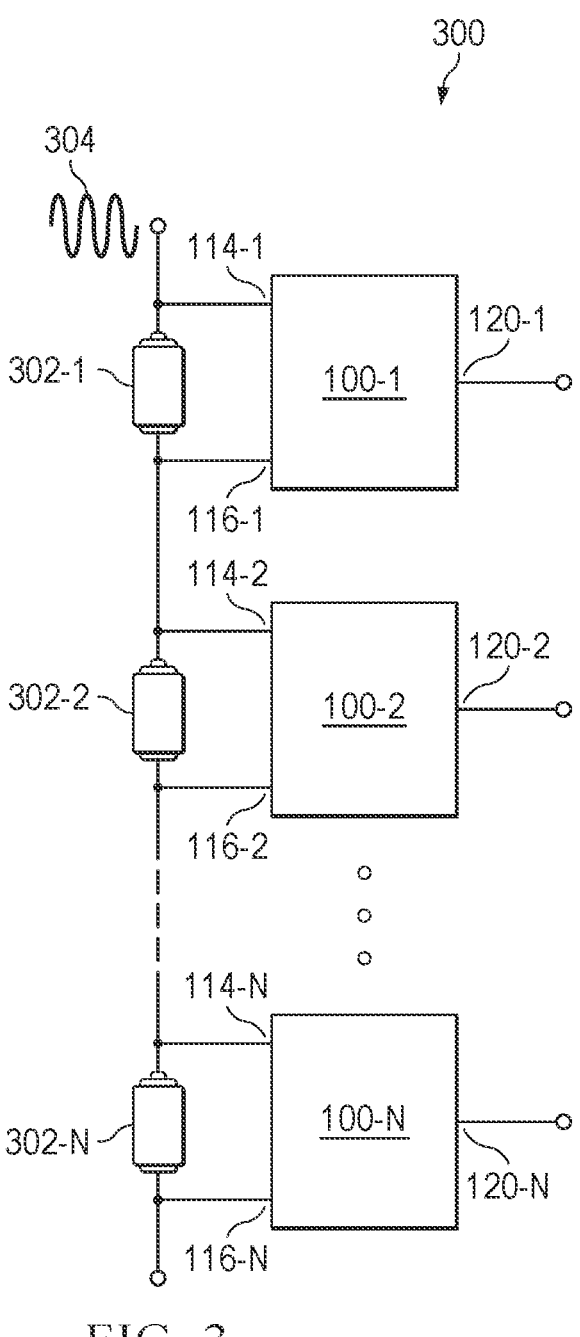
FIG. 3 is a schematic diagram including a plurality of battery cells and a plurality of auto-zero amplifiers in accordance with some aspects of the present disclosure.

FIG. 3 illustrates an electronic system 300 in accordance with some aspects of the present disclosure. The electronic system 300 includes N battery cells 302-1, 302-2, 302-N (e.g., as part of a battery pack), which may be arranged in series and collectively referred to as battery cells 302. As an example, the battery cells 302 may be battery cells for an electric vehicle (EV) and/or a hybrid electric vehicle (HEV). In some aspects, each of the battery cells 302 outputs a small voltage, ranging from 1-5 Volts. However, because the battery cells 302 are in series, they can collectively provide a large voltage (e.g., in the range of 50-100 Volts, or more).

In some EV and/or HEV applications, it may be desirable to monitor a voltage across each of the battery cells 302 during operation. Based on the monitored voltages, system parameters may be adjusted for better performance, fuel efficiency, etc. In order to improve accuracy when measuring small battery cell voltages, it is desirable to use auto-zero amplifiers to reduce the effects of input offset voltage. However, AC noise 304 is often present in the EV environment, due to the inverter, charging, discharging, etc. In some examples, the AC noise 304 can range up to +−4 Volts from 1 to 10 kilohertz (kHz).

Illustrated are N auto-zero amplifiers 100-1, 100-2, 100-N (collectively referred to as auto-zero amplifiers 100) having first voltage input terminals 114-1, 114-2, 114-N and second voltage input terminals 116-1, 116-2, 116-N coupled across terminals of the battery cells 302-1, 302-2, 302-N respectively. In some aspects, the auto-zero amplifiers 100 each have a gain of 1, such that a voltage at an output terminal 120-1, 120-2, 120-N is approximately equal to the voltage of the battery cells 302-1, 302-2, 302-N respectively. The present example utilizes the auto-zero amplifier 100. However, other auto-zero amplifiers (as described throughout the present disclosure) may be substituted in place of the auto-zero amplifier 100. As described above with regards to FIGS. 1-2, each of the auto-zero amplifiers 100 (e.g., 100-1, 100-2, 1002N) is advantageously designed to decouple a first amplifier within the auto-zero amplifier from the first and second input terminals 114, 116 during the auto-zero phase, thereby removing AC noise that may negatively impact the auto-zeroing process. In some aspects, the auto-zero amplifier 100 is part of a high voltage analog front end (HV AFE) as part of a stackable battery monitor for EVs and/or HEVs.

An EV or HEV battery may include many battery cells 302 stacked together. As a result, a differential voltage between a given cell and ground may be very high (e.g., up to 90 Volts for 18 stacked cells). The auto-zero amplifiers 100 serve as a HV AFE by providing an interface to measure a differential voltage between two terminals of a battery cell (e.g., 90 Volts and 85 Volts) and level shift the voltage to a smaller voltage (e.g., 5 Volts and 0 Volts). The smaller voltage may then be coupled to an analog to digital converter, which may not support such high voltages relative to ground.

In some aspects, the sample and hold procedure are described with reference to FIG. 2 advantageously avoids large voltage transients during switching. For example, if the first input terminal 114 and the second input terminal 116 are connected to a last (e.g., highest voltage) battery cell of a plurality of battery cells, the first input terminal 114 may be connected to 90 Volts and the second input terminal 116 may be connected to 85 Volts, relative to ground. Since the voltage sampled by the sampling capacitor 204 is between 85-90 volts (e.g., 85-90 Volts+–4 Volts AC noise) a large voltage transient can be avoided during switching of the first main switch 124, second main switch 126, and equalizing switch 206. In contrast, if a regulated DC voltage were to be used (e.g., from internal or external reference), such a regulated DC voltage may be very low (e.g., 5 Volts) which would introduce a large voltage transient when switching to the first input terminal 114 and the second input terminal 116 (e.g., 90 Volts and 85 Volts respectively), which may result in large amounts of charge injection into sensitive components.

Figure 4A:
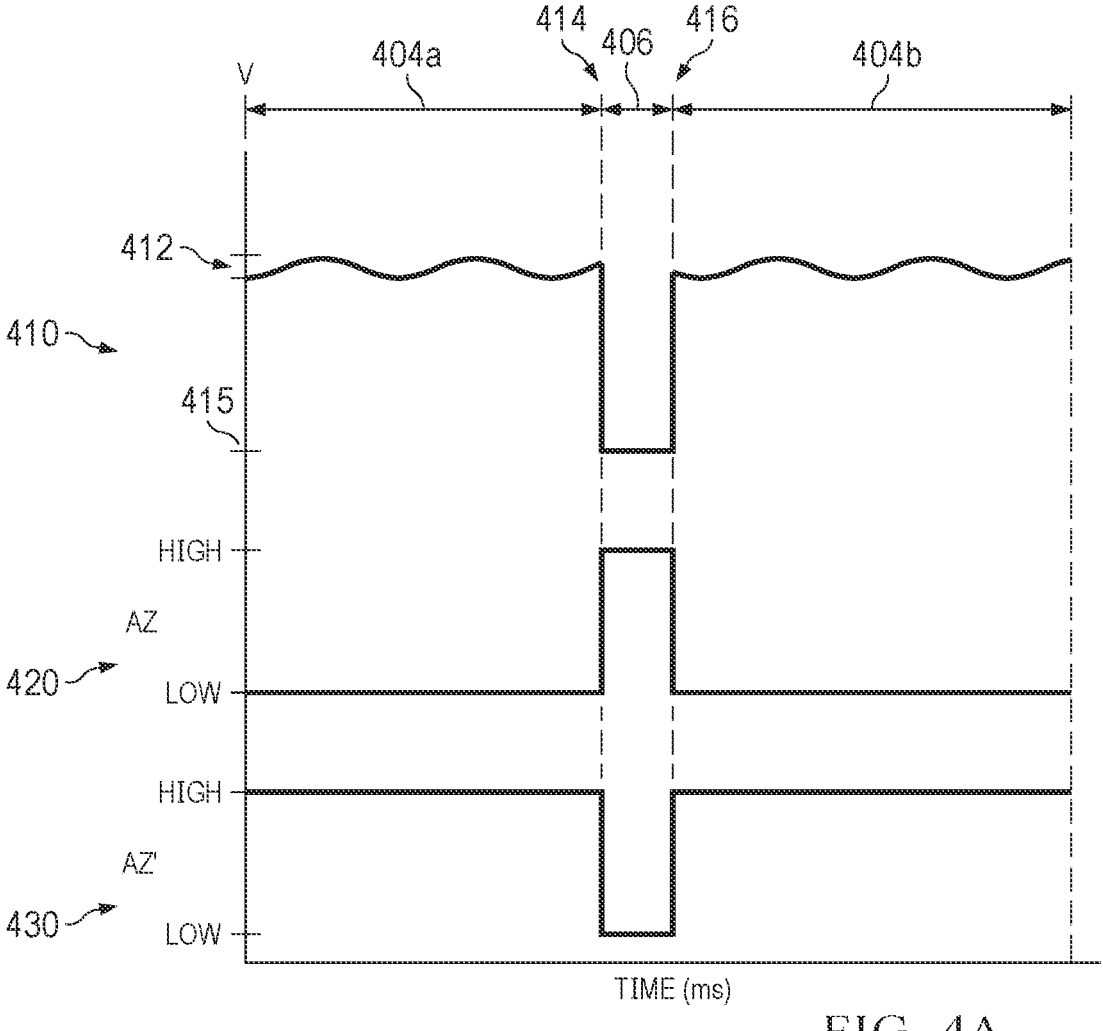
FIGS. 4A-4B are waveform diagrams illustrating voltages over time at an input terminals of auto-zero amplifiers in accordance with some aspects of the present disclosure.

FIG. 4A includes a waveform diagram 410 illustrating voltage over time at an input of an auto-zero amplifier, for example, at the second input 112 of the first amplifier 104 of the auto-zero amplifier 100, as described with reference to FIG. 1. During a first operation phase 404a of the auto-zero amplifier 100, the signal AZ is low and the signal AZ' is high as illustrated by waveforms 420 and 430 respectively, though in other embodiments the AZ signal can be high and the AZ' signal can be low. The second input 112 of the first amplifier 104 is coupled to the second input terminal 116, which may have a voltage 412 comprising a DC voltage around ~85 Volts, and an AC voltage around +–4 Volts during the first operation phase 404a.

At a first point in time 414, the auto-zero amplifier 100 enters an auto-zero phase 406, where the signal AZ is high and the signal AZ' is low. During the auto-zero phase 406, the first and second inputs 110, 112 of the first amplifier 104 are coupled to a regulated (e.g., constant, flat) DC voltage 415, for example the voltage Vbias as described with reference to FIG. 1. The voltage Vbias is provided to both the first input 110 and the second input 112 of the first amplifier 104 and used to calibrate the first auto-zero capacitor 138. At a second point in time 416, the auto-zero amplifier 100 switches back to the operation phase 404b (e.g., AZ is low and AZ' is high). The second input 112 of the first amplifier 104 is coupled to the second input terminal 116, and the calibrated voltage stored on the first auto-zero capacitor 138 is used to compensate for an input offset voltage of the auto-zero amplifier 100.

Notably, in FIG. 4A's example, the AC component of voltage 412 (e.g., AC noise and/or ripple) is present on the first and/or second input of the first amplifier during the operational phases 404a, 404b. For example, the AC component of voltage 412 may be common-mode AC noise. To help ensure accurate auto-zeroing and facilitate low voltage offset for the auto-zero amplifier, the first and second inputs see only DC voltage 415 during the auto-zero phase 406. Thus, the auto-zeroing techniques provided herein provide lower voltage offset than other approaches.

Figure 4B:
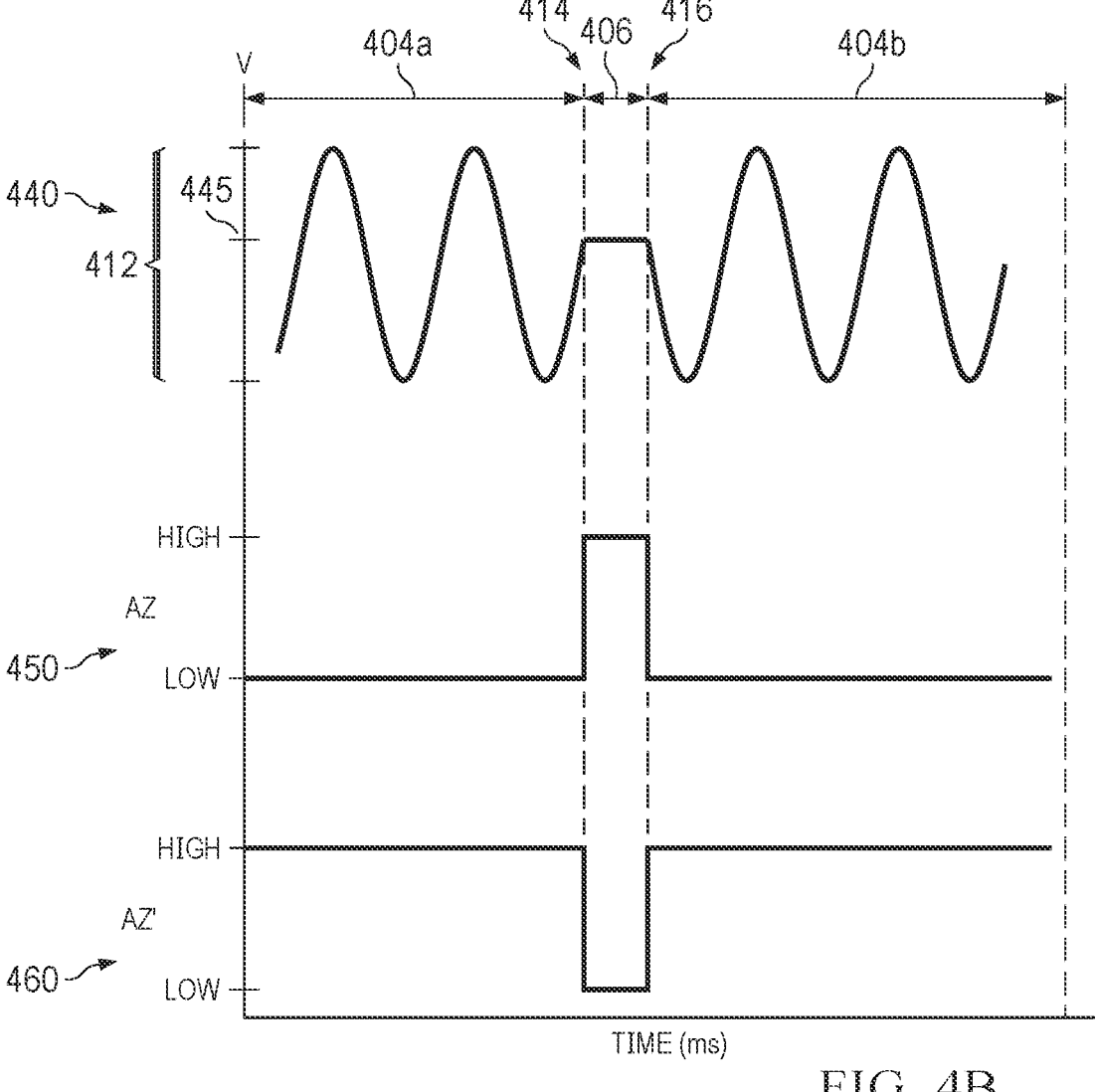

FIG. 4B includes a waveform diagram 440 illustrating voltage over time at an input of an auto-zero amplifier, for example, at the second input 112 of the first amplifier 104 of the auto-zero amplifier 200, as described with reference to FIG. 2. During a first operation phase 404a of the auto-zero amplifier 200, the signal AZ is low and the signal AZ' is high as illustrated by waveforms 450 and 460 respectively. The second input 112 of the first amplifier 104 is coupled to the second input terminal 116, which may have a voltage 412 comprising a DC voltage around ~85 Volts, and an AC voltage around +–4 Volts during the first operation phase 404a.

During the first operation phase 404a, the sampling capacitors 204a, 204b are coupled to the first and second input terminals 114, 116 respectively. As a result, during the operation phase, a voltage of the sampling capacitor 204 tracks (e.g., "samples") a voltage of the first and second input terminals 114, 116. At a first point in time 414, the auto-zero amplifier 200 enters an auto-zero phase 406, where the signal AZ is high and the signal AZ' is low. During the auto-zero phase 406, the first and second inputs 110, 112 of the first amplifier 104 are held at the common mode voltage 445 stored on the sampling capacitor 204. Furthermore, the first input 110 of the first amplifier 104 is coupled to the second input 112 of the first amplifier 104, and the first auto-zero capacitor 138 is calibrated. Although the "held" voltage 445 of the sampling capacitor 204 may vary depending on the specific voltage of the AC component when the auto-zero phase is entered at the first time 414, the exact voltage is not important for auto-zeroing purposes. The "held" voltage 445 has minimal AC noise, and is provided to both the first and second inputs 110, 112 of the first amplifier 104 (e.g., a potential difference of 0 Volts). At a second point in time 416, the auto-zero amplifier 200 switches back to the operation phase 404b (e.g., AZ is low and AZ' is high). The second input 112 of the first amplifier 104 is coupled to the second input terminal 116, and the calibrated voltage stored on the first auto-zero capacitor 138 is used to compensate for an input offset voltage of the auto-zero amplifier 200.

Figure 5:
FIG. 5 is a circuit schematic of an auto-zero amplifier including a switching network connected to a DC bias voltage in accordance with some aspects of the present disclosure.
Figure 6:
FIG. 6 is a circuit schematic of an auto-zero amplifier including a switching network and a capacitor to sample and hold a DC voltage in accordance with some aspects of the present disclosure.

FIG. 5 and FIG. 6 illustrate auto-zero amplifiers 500, 600 respectively in accordance with some aspects of the present disclosure. The auto-zero amplifiers 500, 600 include first and second input terminals 114, 116 on which an input voltage potential is received, and an output terminal 120 on which an output voltage potential is provided. As illustrated in FIG. 5, the auto-zero amplifier 500 includes a first switching network 102, first amplifier 104, and auto-zeroing circuitry 122, which may be, for example, consistent with the first switching network 102, first amplifier 104, and auto-zeroing circuitry 122 as described with reference to FIG. 1. As illustrated in FIG. 6, the auto-zero amplifier 600 includes a first switching network 202, first amplifier 104, and auto-zeroing circuitry 122, which may be, for example, consistent with the first switching network 202, first amplifier 104, and auto-zeroing circuitry 122 as described with reference to FIG. 2.

The first amplifier 104 includes a third amplifier 502 and a fourth amplifier 504. A first resistor 506 and a first capacitor 507 are coupled to a first input of the third amplifier 502. A second input of the third amplifier 502 is coupled to a first node 508. The first node 508 is coupled to a second resistor 510, a first P-type metal-oxide-semiconductor (PMOS) transistor 512, and a second PMOS transistor 514. The second PMOS transistor 514 is coupled to a third PMOS transistor 516.

A third resistor 518 and a second capacitor 520 are coupled to a first input of the fourth amplifier 504. A second input of the fourth amplifier 504 is coupled to a second node 522. The second node 522 is coupled to the second resistor 510, a fourth PMOS transistor 524, and a fifth PMOS transistor 526. The fifth PMOS transistor is coupled to a sixth PMOS transistor 528.

A voltage VB1 is provided to the gates of third and sixth PMOS transistors 516, 528. A voltage VB2 is provided to the gates of second and fifth PMOS transistors 514, 526. The fourth PMOS transistor is coupled to the auto-zeroing circuitry 122 and the output terminal 120.

The auto-zeroing circuitry 122 further comprises a current sink/source circuitry 530. The current sink/source circuitry is configured to sink/source current to adjust a voltage at the output terminal 120 according to a voltage output by the second amplifier 132 in order to compensate for input offset voltage. The current sink/source circuitry 530 comprises a first N-type metal-oxide-semiconductor (NMOS) transistor 532 and a second NMOS transistor 534. An output 536 of the second amplifier 132 is coupled to the first and second NMOS transistors 532, 534, and a current Ioffset adjusts for input offset voltage. Voltages VB3, VB4 are provided to gates of the first and second NMOS transistors 532, 534 respectively. A fourth resistor 538 is coupled to the output terminal 120.

Figure 7:
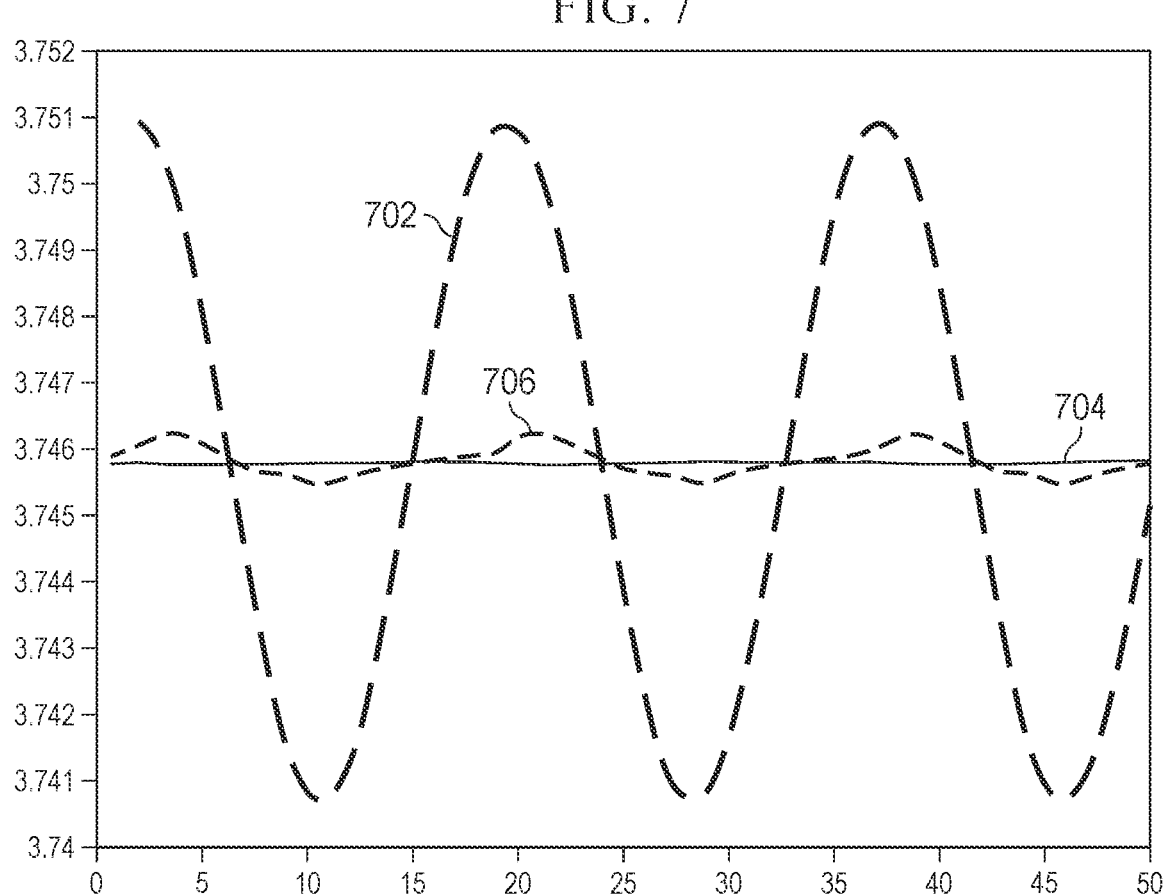
FIG. 7 is a waveform diagram illustrating voltage over time at an auto-zero capacitor during an auto-zero phase in accordance with some aspects of the present disclosure.

Accurate calibration of the first auto-zero capacitor 138 is important when canceling the non-zero offset of the auto-zero amplifier (e.g., any one of the auto-zero amplifiers 100, 200, 500, 600). FIG. 7 illustrates the improved auto-zero capacitor calibration in accordance with some embodiments of the present disclosure, while FIG. 8 illustrate the resulting improved accuracy of the output.

FIG. 7 is a waveform diagram illustrating voltage over time at an auto-zero capacitor during an auto-zero phase in accordance with some aspects of the present disclosure.

As an example, waveform 704 illustrates how a voltage of an auto-zero capacitor 138 varies during an auto-zero mode consistent with some examples of an auto-zero amplifier 100 of FIG. 1, and waveform 706 illustrates how a voltage of an auto-zero capacitor 138 varies during an auto-zero mode consistent with some examples of an auto-zero amplifier 200 of FIG. 2. For both of these waveforms 704, 706, a DC voltage is used for auto-zeroing purposes (e.g., the voltage Vbias for waveform 704 and the voltage on the sampling capacitor 204 for waveform 706 respectively), thereby result in a better calibration of the first auto-zero capacitor 138 when compared to other approaches, such as other waveform 702 during which AC noise was present on first and second inputs during auto-zero mode. For instance, the waveform 704 exhibits a peak to peak voltage of approximately +−19 uV and the waveform 706 exhibits a peak to peak voltage of approximately +−391 uV; while the other approach of waveform 702 exhibits a peak to peak voltage of more than +−10 mV.

Figure 8:
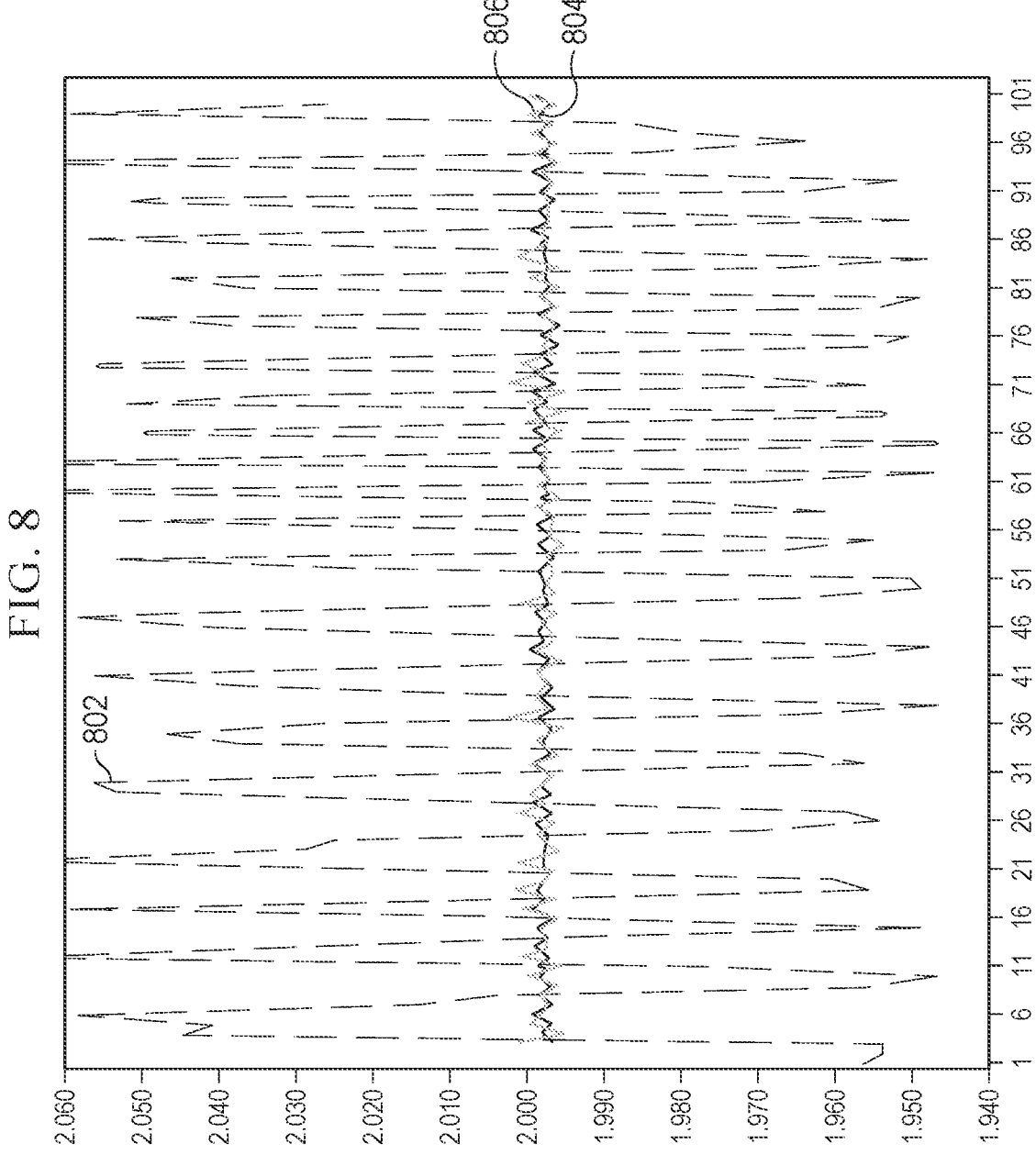
FIG. 8 is a waveform diagram illustrating an output voltage of an auto-zero amplifier in accordance with some aspects of the present disclosure.

FIG. 8 is a waveform diagram illustrating an output voltage of an auto-zero amplifier in accordance with some aspects of the present disclosure, and which follow from FIG. 7's waveforms. Waveform 804 corresponds to an output voltage of the auto-zero amplifier 100 or 200 given the auto-zero capacitor voltage of waveform 704. The steady auto-zero capacitor voltage from waveform 704 results in a low noise output, for example, +−1.3 mV. A waveform 806 corresponds to an output voltage of the auto-zero amplifier 100 given the auto-zero capacitor voltage of waveform 706. Similarly, the steady auto-zero capacitor voltage from waveform 706 results in a very low noise output, for example, +−2.1 mV. Compared to the other approach in which DC noise is present on the first and/or second input (see waveform 802), the present auto-zero amplifier techniques provide an output with a significantly lower offset voltage.

Figure 9:
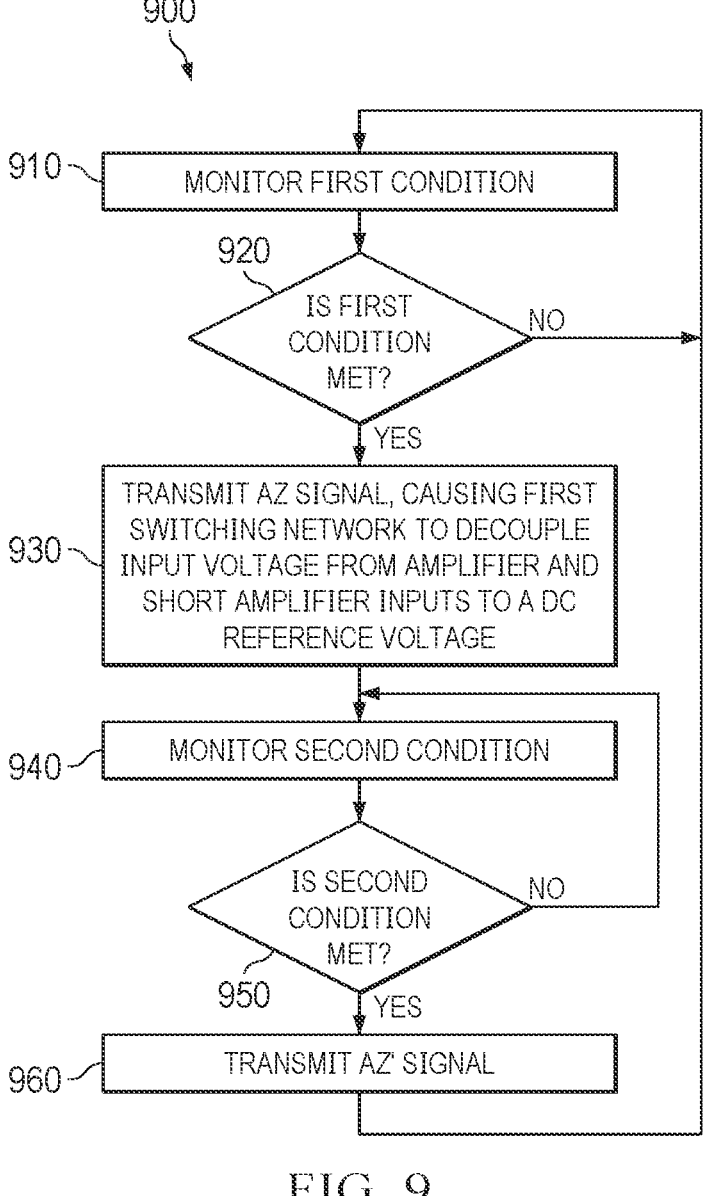
FIG. 9 is a logic flow diagram depicting a method for generating an auto-zero reference using a DC voltage in accordance with some aspects of the present disclosure.

FIG. 9 is a logic flow diagram depicting a method 900 for generating an auto-zero reference using a DC voltage in accordance with some aspects of the present disclosure. The method 900, for example, may be performed by control circuitry (e.g., the control circuit 150).

Step 910 includes monitoring a first condition. Step 920 includes checking if the first condition is met. If the first condition is met, then step 930 is performed. Otherwise, step 910 is performed again. In some embodiments, the first condition is a condition that triggers the auto-zero phase. For example, the auto-zero phase may be initiated periodically according to a timer, and the first condition corresponds to an expiration of the timer.

Step 930 includes transmitting the signal AZ, which corresponds to the auto-zero phase. The signal AZ causes the first switching network to decouple input voltage, which may include AC common-mode noise, from inputs of an amplifier (e.g., first amplifier 104). The inputs of the amplifier are shorted to a DC reference voltage, for example, the voltage Vbias or a voltage stored on the capacitor 204a and/or the capacitor 204b. The signal AZ may be transmitted, for example, by the control circuit 150.

Step 940 includes monitoring a second condition. Step 950 includes checking if the second condition is met. If the second condition is met, then step 960 is performed. Otherwise, step 940 is performed again. In some embodiments, the second condition is a condition that triggers the operation phase. For example, a timer may be started upon entering the auto-zero phase, and the second condition corresponds to an expiration of the timer.

At step 960, the signal AZ' is transmitted, which corresponds to the operation phase. The signal AZ' causes the first switching network to couple the input voltage to the inputs of the amplifier (e.g., the first amplifier 104). Subsequently, the method 900 may be repeated, starting again with step 910.

The methods are illustrated and described above as a series of operations or events, but the illustrated ordering of such operations or events is not limiting. For example, some operations or events may occur in different orders and/or concurrently with other operations or events apart from those illustrated and/or described herein. Also, some illustrated operations or events are optional to implement one or more aspects or examples of this description. Further, one or more of the operations or events depicted herein may be performed in one or more separate operations and/or phases. In some examples, the methods described above may be implemented in a computer readable medium using instructions stored in a memory.

In this description, the term "couple" may cover connections, communications or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor, a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other examples, additional or fewer features may be incorporated into the integrated circuit. Also, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of that parameter. Modifications are possible in the described examples, and other implementations are possible, within the scope of the claims.

What is claimed is:

1. A circuit, comprising:
   a first input voltage terminal;
   a second input voltage terminal;
   a direct current (DC) voltage terminal;
   an output voltage terminal;
   a first switch;
   a second switch;
   a first amplifier having a first input coupled to the first input voltage terminal via the first switch, a second input coupled to the second input voltage terminal via the second switch, and an output coupled to the output voltage terminal;
   a second amplifier having a first input coupled to the output of the first amplifier, a second input coupled to the DC voltage terminal, and an output coupled to the output voltage terminal;
   a third switch coupled between the first and second inputs of the first amplifier;
   a control circuit having an output coupled to a control terminal of the third switch; and
   an inverter coupled between the output and control terminals of the first and second switches.

2. The circuit of claim 1, further comprising:
   a fourth switch, wherein the output of the first amplifier is coupled to the first input of the second amplifier via the fourth switch; and
   a fifth switch, wherein the DC voltage terminal is coupled to the second input of the second amplifier via the fifth switch.

3. The circuit of claim 2, further comprising:
   a first sampling capacitor coupled to the first input of the first amplifier;
   a second sampling capacitor coupled to the second input of the first amplifier;
   a first auto-zero capacitor coupled to the first input of the second amplifier; and
   a second auto-zero capacitor coupled to the second input of the second amplifier.

4. The circuit of claim 1, further comprising:
   a current sink/source circuit coupled between the output of the second amplifier and the output voltage terminal.

5. A circuit, comprising:
   a first input voltage terminal;
   a second input voltage terminal;
   a third input voltage terminal;
   a first amplifier, comprising:
     a first input;
     a second input;
     an output;

a first main switch coupled between the first input voltage terminal and the first input of the first amplifier;

a second main switch coupled between the second input voltage terminal and the second input of the first amplifier;

a third main switch coupled between the third input voltage terminal and the first input of the first amplifier;

a fourth main switch coupled between the third input voltage terminal and the second input of the first amplifier;

a second amplifier, comprising:

a first input;

a second input; and an output;

a first auto-zero switch coupled between the output of the first amplifier and the first input of the second amplifier; and a second auto-zero switch coupled between a fourth input voltage terminal and the second input of the second amplifier;

a first transistor and a second transistor, wherein the output of the second amplifier is coupled to the output of the first amplifier via the first transistor, and the output of the second amplifier is coupled to a ground via the second transistor.

6. The circuit of claim 5, wherein the third input voltage terminal is coupled to a regulated direct current (DC) voltage, and wherein the regulated DC voltage is approximately 5 Volts.

7. The circuit of claim 5, further comprising:

a first auto-zero capacitor coupled to the first input of the second amplifier; and a second auto-zero capacitor coupled to the second input of the second amplifier.

8. The circuit of claim 7, wherein the first amplifier comprises:

a third amplifier having a first input coupled to the first input of the first amplifier, a second input, and an output;

a fourth amplifier having a first input coupled to the second input of the first amplifier, a second input, and an output; and a first resistor;

wherein the second input of the third amplifier and the second input of the fourth amplifier are coupled via a resistor.

9. The circuit of claim 8, wherein the first amplifier further comprises:

a first capacitor coupled to the first input of the third amplifier;

a second capacitor coupled to the first input of the fourth amplifier;

a second resistor; and a third resistor;

wherein the first input of the third amplifier is coupled to the first input of the first amplifier via the second resistor; and wherein the first input of the fourth amplifier is coupled to the second input of the first amplifier via the third resistor.

10. The circuit of claim 9, wherein the first amplifier further comprises:

a third transistor having a first terminal connected to the second input voltage terminal of the third amplifier, and a control terminal coupled to the output of the third amplifier; and a fourth transistor having a first terminal connected to the second input voltage terminal of the fourth amplifier, a second terminal connected to the output of the first amplifier, and a control terminal coupled to the output of the fourth amplifier.

11. The circuit of claim 10, wherein the first amplifier further comprises:

a fifth transistor having a first terminal and a second terminal; and a sixth transistor having a first terminal and a second terminal;

wherein the first terminal of the fifth transistor is coupled to a supply voltage, wherein the second terminal of the fifth transistor is coupled to the first terminal of the sixth transistor; and wherein the second terminal of the sixth transistor is coupled to the second terminal of the third amplifier.

12. The circuit of claim 11, wherein the first amplifier further comprises:

a seventh transistor having a first terminal and a second terminal; and an eighth transistor having a first terminal and a second terminal;

wherein the first terminal of the seventh transistor is coupled to the supply voltage, wherein the second terminal of the seventh transistor is coupled to the first terminal of the eighth transistor; and wherein the second terminal of the eighth transistor is coupled to the second terminal of the fourth amplifier;

wherein control terminals of the fifth and seventh transistors are coupled together; and wherein control terminals of the sixth and eighth transistors are coupled together.

13. An auto-zero amplifier, comprising:

a first amplifier having a first input, a second input, and an output;

a first switching network coupled to the first and second inputs of the first amplifier, wherein the first switching network is configured to provide a first input voltage to the first input of the first amplifier and a second input voltage to the second input of the first amplifier during an operation phase, and wherein the first switching network is configured to couple the first and second inputs of the first amplifier during an auto-zero phase;

a sampling capacitor coupled to the second input of the first amplifier and configurable to sample a voltage of the second input of the first amplifier during the operation phase and hold the voltage of the second input of the first amplifier during the auto-zero phase; and auto-zeroing circuitry coupled to the output of the first amplifier, wherein auto-zeroing circuitry comprises a first auto-zero capacitor, and wherein the auto-zeroing circuitry is configured to compensate for an input offset voltage of the first amplifier during the operation phase based on a voltage of the first auto-zero capacitor.

14. The auto-zero amplifier of claim 13, wherein the first switching network comprises:

a first main switch configured to provide the first input voltage to the first input of the first amplifier during the operation phase;

a second main switch configured to provide the second input voltage to the second input of the first amplifier during the operation phase; and an equalizing switch configured to couple the first and second inputs of the first amplifier during an auto-zero phase.

15. The auto-zero amplifier of claim 13, wherein the auto-zeroing circuitry further comprises:

a fourth switch configured to couple the output of the first amplifier to the first auto-zero capacitor during the auto-zero phase.

16. The auto-zero amplifier of claim 15, wherein the auto-zeroing circuitry further comprises:

a second amplifier comprising: a first input coupled to the first auto-zero capacitor, a second input coupled to a regulated direct current (DC) voltage, and an output coupled to the output of the first amplifier.

17. The auto-zero amplifier of claim 16, wherein the auto-zeroing circuitry is configured to source/sink current to/from the output of the first amplifier to compensate for the input offset voltage of the first amplifier.

\* \* \* \* \*